(12) United States Patent
Iwasaki et al.

(10) Patent No.: US 7,324,718 B2
(45) Date of Patent: Jan. 29, 2008

(54) OPTICAL DEVICE AND OPTICAL MODULE

(75) Inventors: Yasunori Iwasaki, Nishikasugai-Gun (JP); Akiyoshi Ide, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/414,971

(22) Filed: May 1, 2006

(65) Prior Publication Data

US 2006/0198573 A1    Sep. 7, 2006

Related U.S. Application Data

(63) Continuation of application No. PCT/JP2004/016752, filed on Nov. 11, 2004.

(30) Foreign Application Priority Data

Nov. 11, 2003   (JP)   ............... 2003-380834

(51) Int. Cl.
*G02B 6/12* (2006.01)
(52) U.S. Cl. .................................................. 385/14
(58) Field of Classification Search ................ 385/14, 385/88–92
See application file for complete search history.

(56) References Cited

U.S. PATENT DOCUMENTS

| | | | | |
|---|---|---|---|---|
| 5,059,787 A | * | 10/1991 | Lou | 257/436 |
| 5,070,596 A | * | 12/1991 | Gaul et al. | 29/620 |
| 5,262,633 A | * | 11/1993 | Kasai et al. | 250/208.1 |
| 5,499,309 A | * | 3/1996 | Kozuka et al. | 385/38 |
| 5,696,862 A | * | 12/1997 | Hauer et al. | 385/88 |
| 5,999,670 A | * | 12/1999 | Yoshimura et al. | 385/31 |
| 6,043,550 A | | 3/2000 | Kuhara et al. | |
| 6,217,231 B1 | * | 4/2001 | Mesaki et al. | 385/88 |
| 6,246,097 B1 | * | 6/2001 | Kato et al. | 257/432 |
| 6,406,196 B1 | * | 6/2002 | Uno et al. | 385/89 |
| 6,465,270 B2 | * | 10/2002 | Lell | 438/47 |
| 2002/0033491 A1 | | 3/2002 | Kuhara et al. | |
| 2004/0067025 A1 | * | 4/2004 | Haraguchi et al. | 385/49 |

FOREIGN PATENT DOCUMENTS

| | | |
|---|---|---|
| JP | 2000-036615 A1 | 2/2000 |
| JP | 2001-264594 A1 | 9/2001 |
| JP | 2002-050785 A1 | 2/2002 |

\* cited by examiner

*Primary Examiner*—Ellen E. Kim
(74) *Attorney, Agent, or Firm*—Burr & Brown

(57) ABSTRACT

A PD array is used in an optical module for monitoring signal light. In the optical module, when monitoring is conducted, signal light that passes through an optical fiber array is branched by a branching section disposed in the optical fiber array, wherein branched light from the branching section is detected by a photodetector region. The PD array is mounted on the optical fiber array. On the back of the base of the PD array, a coating film for preventing degradation in characteristics is formed, wherein the coating film includes an anti-reflective multilayer film.

11 Claims, 13 Drawing Sheets

OPTICAL DEVICE AND OPTICAL MODULE

BACKGROUND OF THE INVENTION

1. Field of the Invention

The present invention relates to an optical device with one or more photodetector regions therein, and an optical module having a single optical fiber or a plurality of optical fibers (optical fiber array), or a single optical waveguide or a plurality of optical waveguides. More particularly, the present invention concerns an optical device and an optical module, which are suitable for monitoring signal light while the signal light is propagated through an optical transmitting means.

2. Description of the Related Art

In present optical communication technology, it is important to monitor communication quality. Particularly, monitoring of optical output plays an important role in the field of wavelength multiplex communication technology.

In recent years, with respect to optical output monitoring technology, there have been growing demands for smaller size, higher performance, and lower cost. Attention has been attracted to a TAP (branching coupler for monitoring an input signal) system, having a slit structure provided directly within the optical fibers or optical waveguides, for extracting and detecting a portion of the signal light in order to monitor signal light quality.

Heretofore, a technique disclosed in Japanese Laid-Open Patent Publication No. 2001-264594, for example, has been proposed. According to the disclosed technique, an optical fiber is placed in a V-shaped groove defined in a glass substrate, and thereafter a parallel groove is defined in the glass substrate obliquely across the optical fiber (the optical axis thereof). A light branching member is inserted into the parallel groove, and an ultraviolet-curable resin (adhesive) is filled in the gap between the light branching member and the groove wall.

From among the signal light that is propagated through the optical fiber, a light component (branched light) branched by the light branching member is extracted out of the cladding. The branched light is detected by a photodetector device, for example, in order to monitor the signal light.

The optical module with the above TAP system must employ a photodetector device, and the branched light should be applied to the photodetector device without degradation in characteristics.

In an in-line optical module having a plurality of optical fibers or optical waveguides in a horizontal array, it is essential to employ photodetector devices having a plurality of photodetector regions corresponding to the optical fibers or optical waveguides. Since the photodetector devices are disposed closely together, they are susceptible to stray light, and when a photocurrent (carrier) generated in each of the photodetector regions partially flows as a leakage current to a common electrode through adjacent or other photodetector regions, crosstalk characteristics tend to be lowered.

As shown in FIG. 13, a conventional photodetector device 100 for detecting light applied to its reverse side has a photodetector region 104 on the surface of a light-transmissive base 102. The reverse side of the base 102 (to which light is applied) is coated with a single film (single-layer film) 106 of highly moisture-resistant SiN or the like for passivation and anti-reflection.

Light is normally applied to the photodetector device 100 perpendicularly to the reverse side of the base 102. When light is applied perpendicularly to the reverse side of the base 102, light can be applied to the photodetector region 104 essentially without changing characteristics of the light at a certain wavelength, e.g., reflection characteristics and polarization dependent loss (PDC: Polarization Dependent Current), simply by changing the thickness of the single-layer film 106.

However, the optical module of the TAP system, which has a slit defined in the optical fibers or the optical waveguides, emits branched light 108 obliquely from the optical fibers or the optical waveguides. In order to apply the branched light 108 perpendicularly to the photodetector region 104 of the photodetector device 100, the photodetector device 100 has to be mounted in place, such that the surface to which the branched light 108 is applied is inclined. When it is mounted in place, it is difficult to control the angle of the photodetector device 100. Therefore, the mounting cost is high, and the optical module tends to become large in size.

The photodetector device 100 may possibly be mounted in place such that the surface to which the branched light 108 is applied lies horizontally, i.e., parallel to the optical axis of the light that passes through the optical fibers or the optical waveguides. With such a configuration, however, the branched light 108 is applied obliquely to the reverse side of the photodetector device 100, with the result that the characteristics of light at a certain wavelength, e.g., reflection characteristics and polarization dependent loss (PDC), vary greatly. Detection accuracy of the branched light 108, i.e., the accuracy at which the signal light can be monitored, is thus reduced.

SUMMARY OF THE INVENTION

It is an object of the present invention to provide an optical device and an optical module, in which the reflection characteristics and the polarization dependent loss (PDC) of branched light essentially are not varied, even when branched light is applied obliquely. The present invention further prevents the accuracy at which signal light is monitored from being reduced, and increases reliability in monitoring signal light.

An optical device according to the present invention includes one or more photodetector regions disposed on a base, wherein a coating film for preventing degradation in characteristics is disposed on a surface to which light is applied.

Even if light is applied obliquely to the light-receiving surface, the reflection characteristics and polarization dependent loss (PDC) of the light essentially are not varied. When the optical device functions to monitor signal light from an in-line TAP optical module, for example, then even when branched light is obliquely applied thereto, the accuracy at which the branched light is detected is prevented from being lowered, and the reliability of the function to monitor signal light can be increased.

The base may be light-transmissive, wherein one or more photodetector regions are disposed on a surface of the base, and the base may have a reverse side that serves as the surface to which light is applied. Theoretically, the optical device may be mounted in place with the reverse side thereof being disposed closely to a light transmitting means, such as optical fibers, optical waveguides, or the like. Furthermore, the incident angle of light (the angle with respect to the vertical direction) may be reduced. This is advantageous in that the efficiency at which light is detected by the photodetector regions can be increased.

According to the present invention, the coating film may comprise a laminated combination of two or more films. Specifically, the coating film should preferably have an anti-reflective multilayer film. If a single-layer film is disposed on the surface to which light is applied, as is conventional, then when light is obliquely applied to the surface, a current (detected current) output from the photodetector regions varies depending on the polarization of the light. That is, the polarization dependent loss is large.

However, according to the present invention, since an anti-reflective multilayer film is provided on the surface to which light is applied, the properties and thickness of the multilayer film can be designed depending on the expected angle of the obliquely applied light. As a result, the polarization of the obliquely applied light can be controlled in order to reduce variations in the detected current, also leading to a reduction in polarization dependent loss.

In the above arrangement, the coating film may comprise a laminated combination of a moisture-resistant film and an anti-reflective multilayer film. If the multilayer film is provided on the surface to which light is applied, then the multilayer film may become porous depending on the conditions under which the multilayer film is formed. If the multilayer film becomes porous, then water passes through the multilayer film and reaches the base, tending to degrade characteristics of the optical device (increased leakage current, increased dark current, etc.). According to the present invention, the coating film comprises a laminated assembly of a moisture-resistant film and an anti-reflective multilayer film, so that the optical device has excellent moisture resistance and can stably pick up a detected current independently of the polarization of the applied light.

In the above arrangement, if a refractive index matching resin is provided on the surface to which light is applied, the coating film may comprise a laminated combination of a film, which prevents degradation in characteristics due to the existence of the resin, and an anti-reflective multilayer film. The film for preventing degradation in characteristics due to the existence of the resin may comprise a moisture-resistant film.

When a refractive index matching resin is provided on the surface to which light is applied, a resin capable of adsorbing water may be used. The multilayer film alone is unable to prevent water from entering the base, and may possibly allow characteristics of the optical device to become degraded (increased leakage current, increased dark current, etc.). According to the present invention, the coating is constructed of a film, which prevents degradation in characteristics due to the existence of the resin, and an anti-reflective multilayer film, so that the optical device has excellent moisture resistance and can stably pick up a detected current independently of the polarization of the applied light.

In the above arrangement, the optical device may further comprise one or more light blocking masks disposed on an end face of the coating film, wherein the light blocking masks are positioned in view of the light which is obliquely applied to the coating film.

Crosstalk is an important factor influencing characteristics of the output current of the optical device, as well as polarization dependent loss. One of the causes of crosstalk is stray light. When light is applied to a region of the optical device other than the photodetector regions, and repeatedly reflected and diffused, such light is applied as stray light to adjacent photodetector regions or to other photodetector regions, thus causing crosstalk.

One effective means for preventing stray light is to provide a mask disposed on the surface to which light is applied. The mask limits the application of light, whereby the light introduced into the optical device is detected by the photodetector regions and converted into a current (detected current). No light is applied to regions other than the photodetector regions. The mask is usually disposed in a position corresponding to the photodetector regions.

If a reverse-side-incident type of optical device is used, then there is a certain distance from the surface to which light is applied to the photodetector regions. Even if the mask has windows disposed directly below the photodetector regions, obliquely applied light includes light that does not reach the photodetector regions, and such light may become stray light. In addition, light which enters the photodetector regions is blocked by the mask, resulting in a reduction in efficiency.

According to the present invention, the mask is disposed in a position, which takes into account such obliquely applied light. The mask thus positioned is capable of almost fully eliminating stray light, thereby improving crosstalk and increasing light detecting efficiency within the photodetector regions.

In addition to the aforementioned optical crosstalk, electric crosstalk may also serve as a factor that affects characteristics of the output current of the optical device. Specifically, if a plurality of photodetector regions are provided on the base, then since a common cathode electrode is connected to the photodetector regions, a portion of the electric charges generated within the photodetector regions flows as leakage current to the common electrode through adjacent and/or other photodetector regions, thereby causing electric crosstalk.

With the above arrangement, if two or more photodetector regions are disposed on the base, since each of the photodetector regions has an anode electrode and a cathode electrode, electric crosstalk is suppressed. If a low-resistance electrode (e.g., of Au) is connected to the cathodes, then the generated carrier does not leak into the cathodes of adjacent channels, but rather is pulled by the low-resistance electrode formed of Au, thereby achieving a reduction in crosstalk.

In the above arrangement, if two or more photodetector regions are disposed on the base, a slit may be defined in the base between the photodetector regions. Since the photodetector regions are physically separated from each other by the slit, the path of leakage current is divided, thereby preventing electric crosstalk as described above. Furthermore, since stray light does not enter into the adjacent and/or other photodetector regions, crosstalk caused by such stray light may also be improved.

In the above arrangement, a plurality of bases may be arrayed at predetermined intervals, wherein each of the bases comprises a photodetector region. Since the path of leakage current is also divided thereby, electric crosstalk may be prevented. Furthermore, since stray light does not enter into adjacent and/or other photodetector regions, crosstalk caused by such stray light may also be improved.

An optical module according to the present invention comprises one or more light transmitting means having a light branching function, and an optical device disposed above the light transmitting means and fixed by a resin within an optical path of branched light which is generated at least by the light branching function of the light transmitting means, wherein the optical device includes a base, one or more photodetector regions disposed on the base, and a coating film disposed on a surface to which light is applied for preventing degradation in characteristics.

Even when branched light is applied obliquely, since the reflection characteristics and polarization dependent loss of the light essentially are not varied, the accuracy at which the branched light is detected is prevented from being lowered, wherein reliability of the function for monitoring signal light may be increased.

With the optical device and the optical module according to the present invention, as described above, even when branched light is applied obliquely, since the reflection characteristics and polarization dependent loss (PDC) of the branched light essentially are not varied, the accuracy at which the branched light is detected is prevented from being lowered, wherein reliability of the function for monitoring signal light may be increased.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

An embodiment according to the present invention, in which an optical device and an optical module are applied to a 12-ch. in-line power monitor module, for example, shall be described below with reference to FIGS. 1 through 12.

Figure 1:
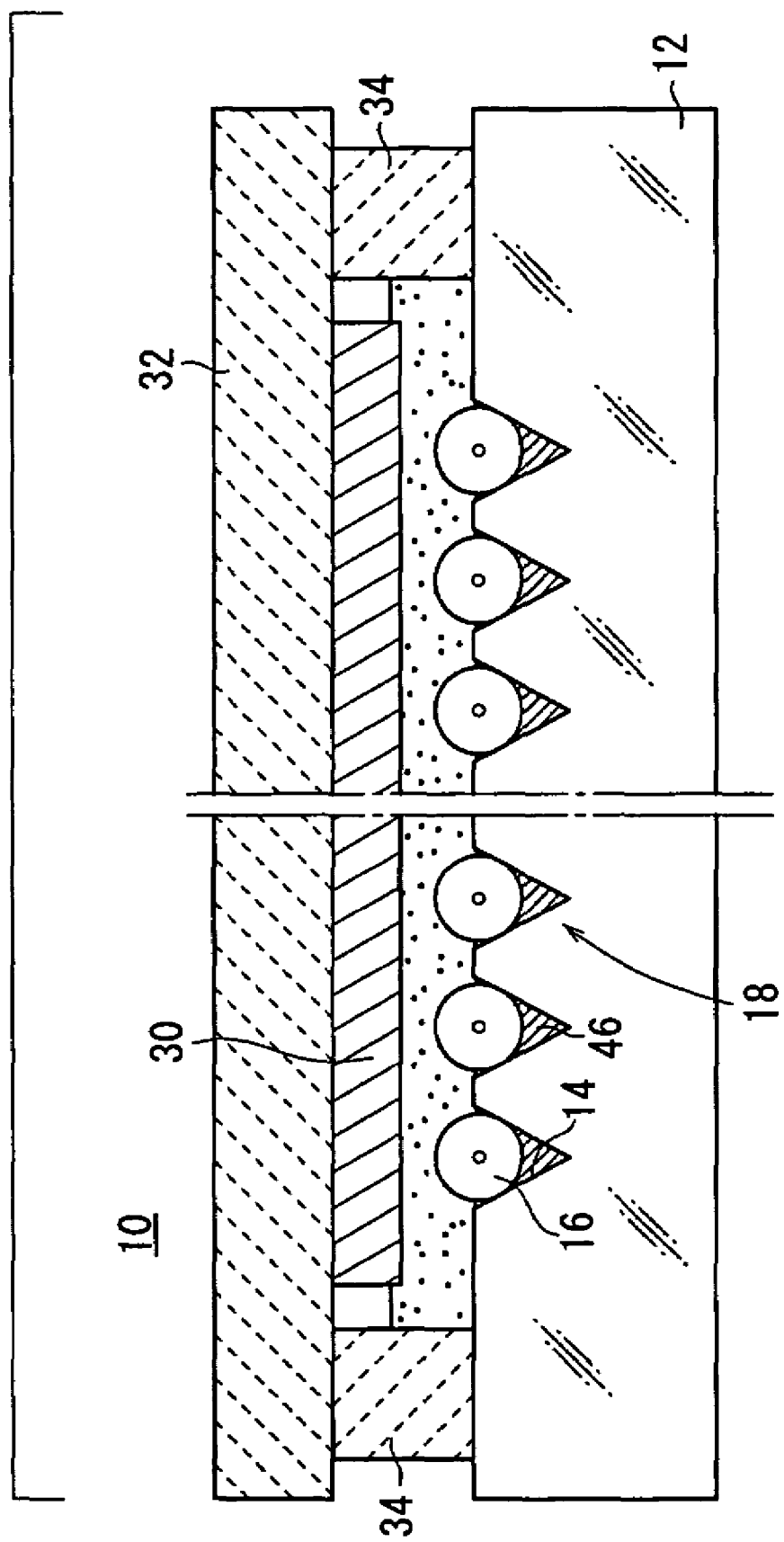
FIG. 1 is a sectional front elevational view of an optical module according to an embodiment of the present invention.
Figure 2:
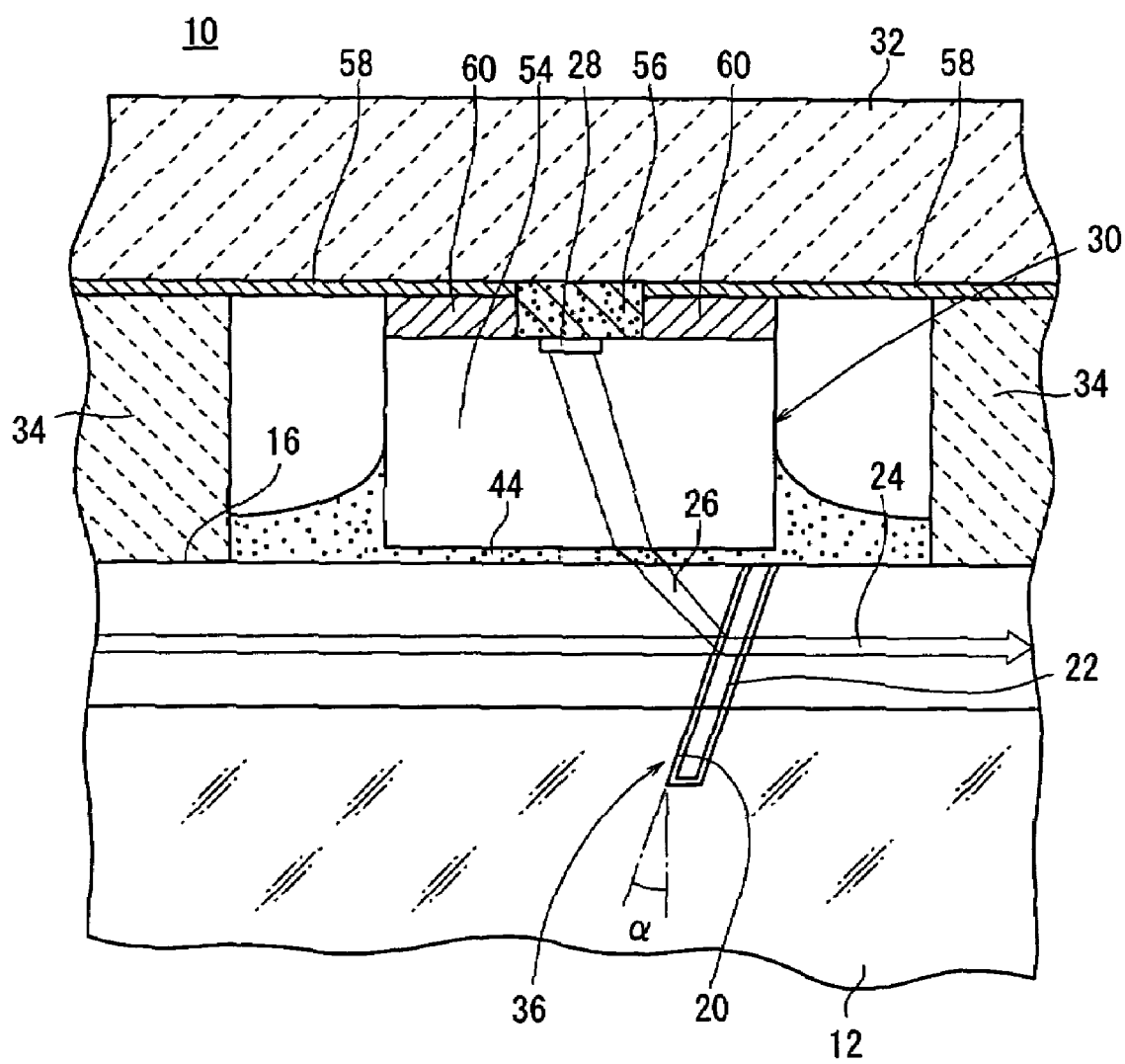
FIG. 2 is a sectional side elevational view of the optical module according to the embodiment of the present invention.
Figure 3:
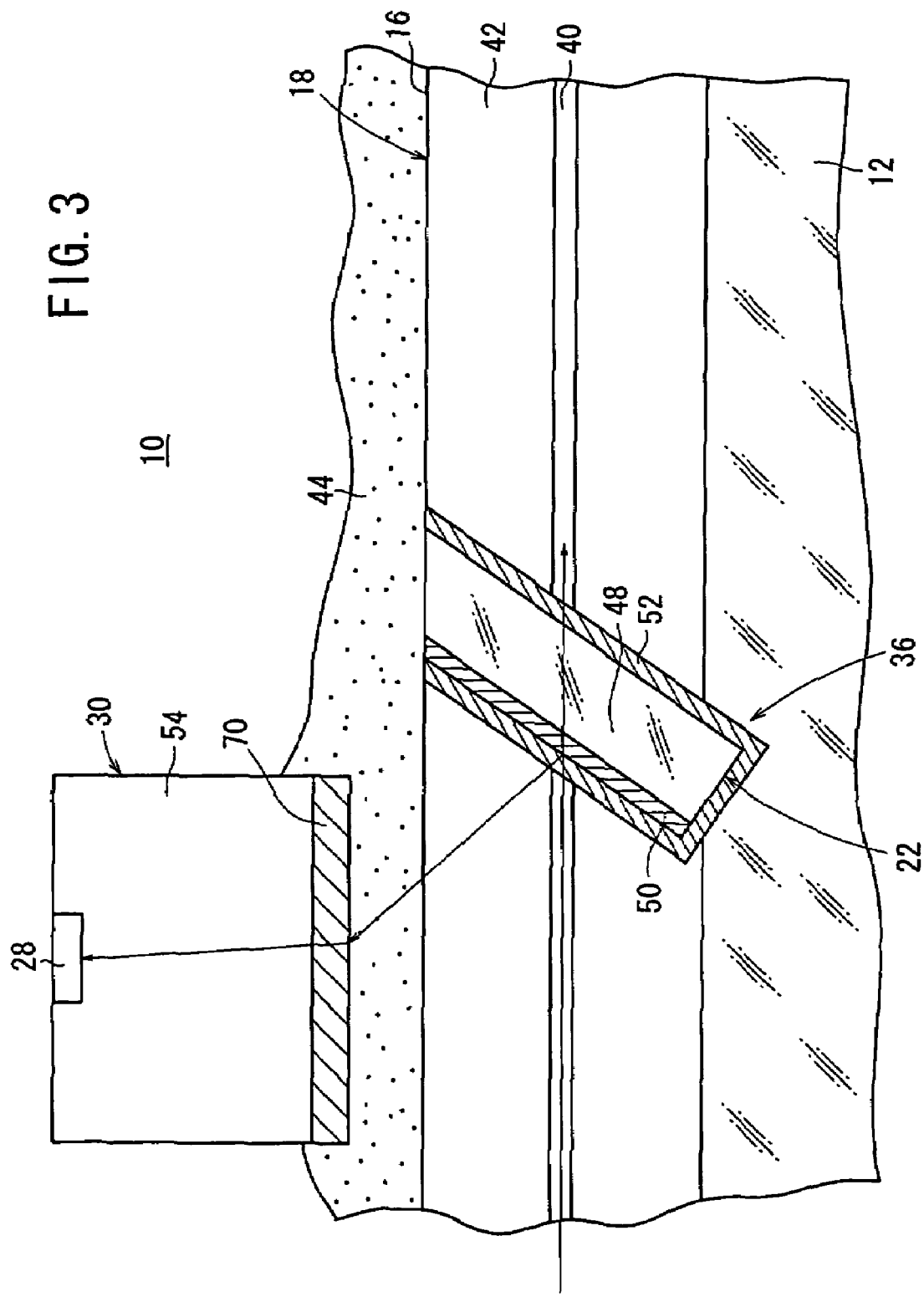
FIG. 3 is an enlarged view of a branching unit of the optical module according to the embodiment of the present invention.

As shown in FIGS. 1 and 2, an optical module 10 according to an embodiment of the present invention has a glass substrate 12, an optical fiber array 18 comprising a plurality of optical fibers 16 fixed in a plurality of V-shaped grooves 14 defined in the glass substrate 12, a slit 20 (see FIG. 2) extending from the upper surfaces of the optical fibers 16 into the glass substrate 12, a branching member (filter member 22, see FIG. 2) 22 inserted into the slit 20, a PD (PhotoDiode) array 30 according to the present embodiment, which has a plurality of photodetector regions 28 for detecting light (branched light) 26 branched by at least the filter member 22, etc., an submount 32 on which the PD array 30 is mounted and which fixes the PD array 30 so as to face toward the optical fiber array 18, and spacers 34 for stably fixing at least the PD array 30. Two end faces of the slit 20 and a face surface and a reverse surface of the filter member 22 function as a branching unit 36 (see FIG. 2), for branching a portion of the signal light 24 that passes through the optical fibers 16. As shown in FIG. 3, the optical fibers 16 each comprise a core 40 and a cladding 42.

Therefore, the optical module 10 according to the present embodiment includes the glass substrate 12, with the V-shaped grooves 14 defined therein, the optical fiber array 18 fixed within the V-shaped grooves 14 in the glass substrate 12, wherein each of the optical fibers 16 has a light branching function (the slit 20, the filter member 22, etc.), the PD array 30 according to the embodiment, which is fixedly mounted outside of the cladding of each of the optical fibers 16 by a resin (refractive index matching resin) 44, so as to lie within the optical path of branched light 26 generated at least by the light branching function, and the submount 32 having the PD array 30 mounted thereon. The submount 32 has a mounting surface for the PD array 30, disposed in confronting relation to the glass substrate 12.

The angle of the V-shaped grooves 14 defined in the glass substrate 12 should preferably be 45° or greater in view of the load that will be applied to each of the optical fibers 16 of the optical fiber array 18 when the slit 20 is subsequently formed. The angle should also preferably be 95° or less to provide a sufficient amount of adhesive (=bonding strength), in order to produce a lid-free optical fiber array. In the present embodiment, the angle is 70°.

The optical fiber array 18 is fixed to the glass substrate 12 by placing the optical fiber array 18 within the V-shaped grooves 14, applying a fixing adhesive (ultraviolet-curable adhesive) 46 (see FIG. 1), and then applying ultraviolet radiation from the reverse side of the optical fiber array 18 and from above the optical fiber array 18 in order to cure the adhesive 46.

The tilt angle α (see FIG. 2) of the slit 20, i.e., the angle with respect to the vertical plane, should preferably be in the range from 15° to 25°. If the tilt angle α is too small, then branched light 26 from the filter member 22 will be spread too widely, tending to impair crosstalk when the optical module is used in multichannel applications. Conversely, if the tilt angle α is too large, then polarization dependent loss of the reflected light 26 from the filter member 22 will be increased, tending to result in degraded characteristics.

As shown in FIG. 3, the filter member 22 has a quartz substrate 48 and a branching multilayer film 50 disposed on a principal surface of the quartz substrate 48. To facilitate handling of the filter member 22, the filter member 22 may be made of a plastic material, a high-polymer material, or a polyimide material. However, since the slit 20 has a large tilt angle α in the range from 15° to 25°, the filter member 22 should preferably be made of a material having the same refractive index as the optical fibers 16 (quartz) in order to prevent the optical axis of transmitted light from being displaced due to refraction.

The gap between the slit 20 and the filter member 22 in the slit 20 is filled with an ultraviolet-curable resin (adhesive) 52. The resin 52 comprises a silicone resin, so that the refractive index thereof is substantially the same as the refractive index of the cores 40 of the optical fibers 16 as well as the refractive index of the quartz substrate 48 of the filter member 22.

As shown in FIG. 2, the PD array 30 is of a structure for detecting light applied to its reverse side. The PD array 30 includes a light-transmissive base 54 and photodetector regions 28 (as many as the number of channels) disposed on the surface of the base 54.

An anisotropic conductive paste 56, rather than gold solder or electrode or silver paste, is disposed upwardly of the photodetector regions 28 (up to the submount 32). The region above the photodetector regions 28 should preferably be of a material having low reflectance, such as an anisotropic conductive paste 56, air, or the like, rather than a material of high reflectance such as gold or the like, from the standpoint of crosstalk. Of course, the PD array 30 may also be a PD array for detecting light applied to its face side.

The photodetector regions 28 of the PD array 30 should preferably have a diameter in the range from 40 to 80 μm. In the present embodiment, the photodetector regions 28 have a diameter of about 60 μm. If the diameter is smaller than 40 μm, then the photodetector regions 28 are too small in size, possibly resulting in a reduction in light detecting efficiency. If the diameter is 80 μm or greater, then since the photodetector regions 28 tend to easily pick up stray light, crosstalk characteristics are liable to degrade.

The submount 32 is mounted in a structure, which includes the optical fiber array 18, the PD array 30, and the submount 32 arranged successively. The submount 32 may further be mounted in a structure, which includes the optical fiber array 18, the submount 32, and the PD array 30 arranged successively. The latter structure is, however, less preferable from the standpoints of light detecting efficiency and crosstalk, because the optical path of the branched light 26 has a large length, which tends to cause the branched light 26 to spread widely due to the submount 32 being positioned between the optical fiber array 18 and the PD array 30. The submount 32 is made of $Al_2O_3$.

When the optical fiber array 18, the PD array 30, and the submount 32 are arranged in succession, if the PD array 30 is of a surface-incident type, then wire bonding is needed for providing conduction from the surface to the submount 32. A space of about 100 μm is required for wire bonding, and such a space needs to be filled with the refractive index matching resin 44, to provide refractive index matching with the optical fibers 16 (quartz) and for reliability. Specifically, if the PD array 30 is of a surface-incident type, then the refractive index matching resin 44 having a thickness of 100 μm is present in the optical path, and introduces instability into characteristics such as PDL (polarization dependent loss) and wavelength dependency. Since the bonding wires are usually made of metal such as Au, if light is applied to the bonding wires, the light is scattered as stray light.

If the PD array 30 is of a reverse-side-incident type, then theoretically, the PD array 30 may be held in contact with the optical fibers 16. However, inasmuch as the PD array 30 and the optical fibers 16, when held in contact with each other, are liable to introduce physical defects, a space (interval) of about 10 μm should be left and filled with the refractive index matching resin 44.

The PD array 30 has anode electrodes and cathode electrodes, which are disposed on the surface of the photodetector regions 28 (facing the submount 32). A common cathode electrode and anode electrodes associated with respective channels are patterned as an Au electrode pattern 58 on the submount 32.

Bumps 60 of Au are disposed in regions corresponding to the anode electrodes of the respective channels and the cathode electrodes, and the region above the photodetector regions 28 is filled with the anisotropic conductive paste 56. The bumps 60 of Au serve to achieve reliable conduction and to increase the inter-electrode distance between the photodetector regions 28 and the submount 32, in order to reduce stray light due to reflection and scattering within such areas. When heat is applied to the anisotropic conductive paste 56, a conductive material such as silver or the like within the anisotropic conductive paste 56 is attracted to conductive areas, such as the bumps 60 of Au, thereby providing conductivity only between the anisotropic conductive paste 56 and the electrode pattern 58 of Au.

Spacers 34 for determining the gap between the optical fiber array 18 and the PD array 30 are fixed to the mounting surface of the submount 32 by an ultraviolet-curable adhesive, for example.

As shown in FIG. 3, the PD array 30 according to the present embodiment includes a coating film 70 for preventing degradation in characteristics, which is disposed on the reverse side of the base 54. The coating film 70 should preferably be constructed of two or more laminated films.

Specific examples of the PD array 30 according to the present embodiment shall be described below with reference to FIGS. 4 through 12.

Figure 4:
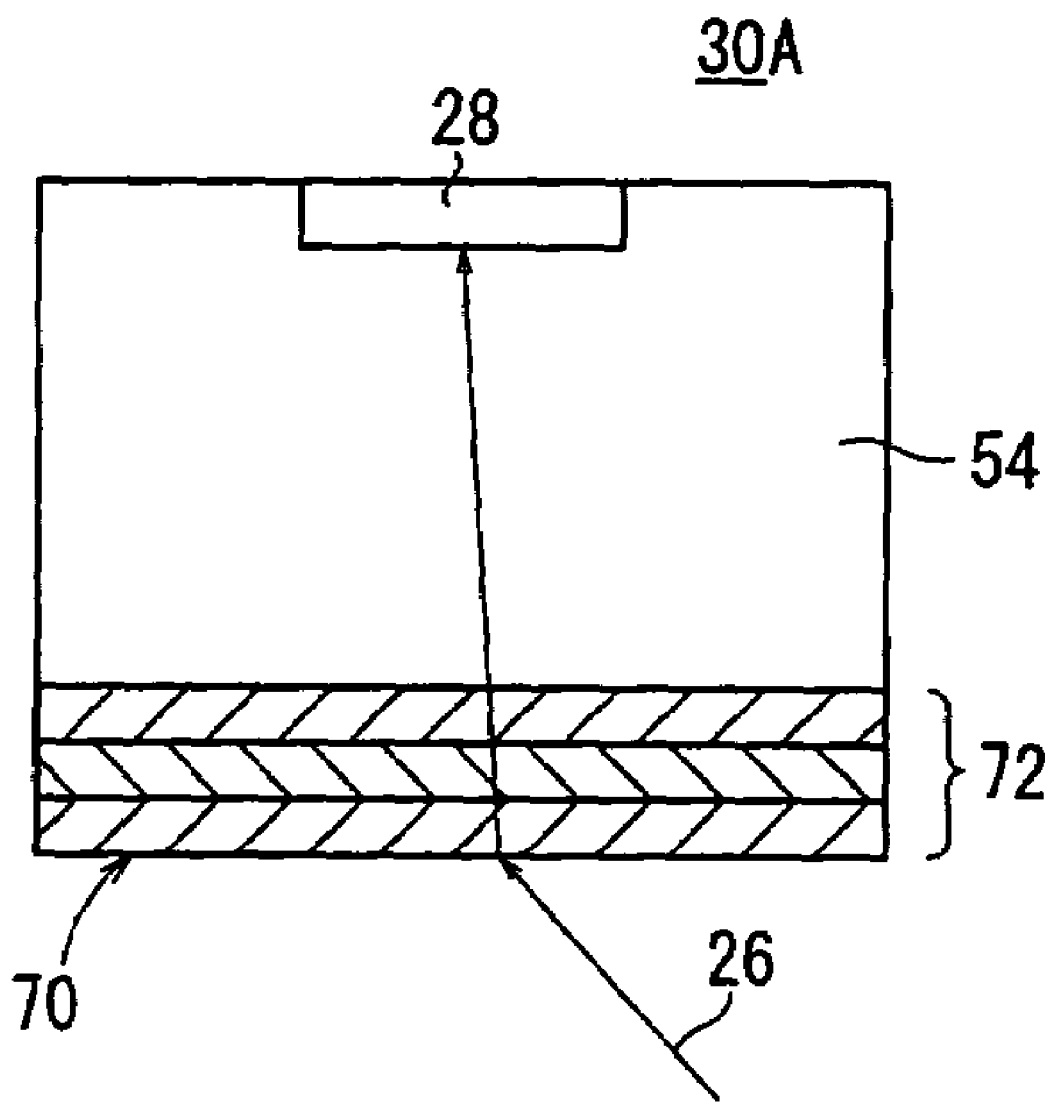
FIG. 4 is a cross-sectional view of a PD array according to a first specific example.

As shown in FIG. 4, a PD array 30A according to a first specific example, with only a representative portion thereof which corresponds to one channel being illustrated, has an anti-reflective multilayer film 72 disposed on the reverse side of the base 54 of the PD array 30A, as the coating film 70 for preventing degradation in characteristics.

Figure 13:
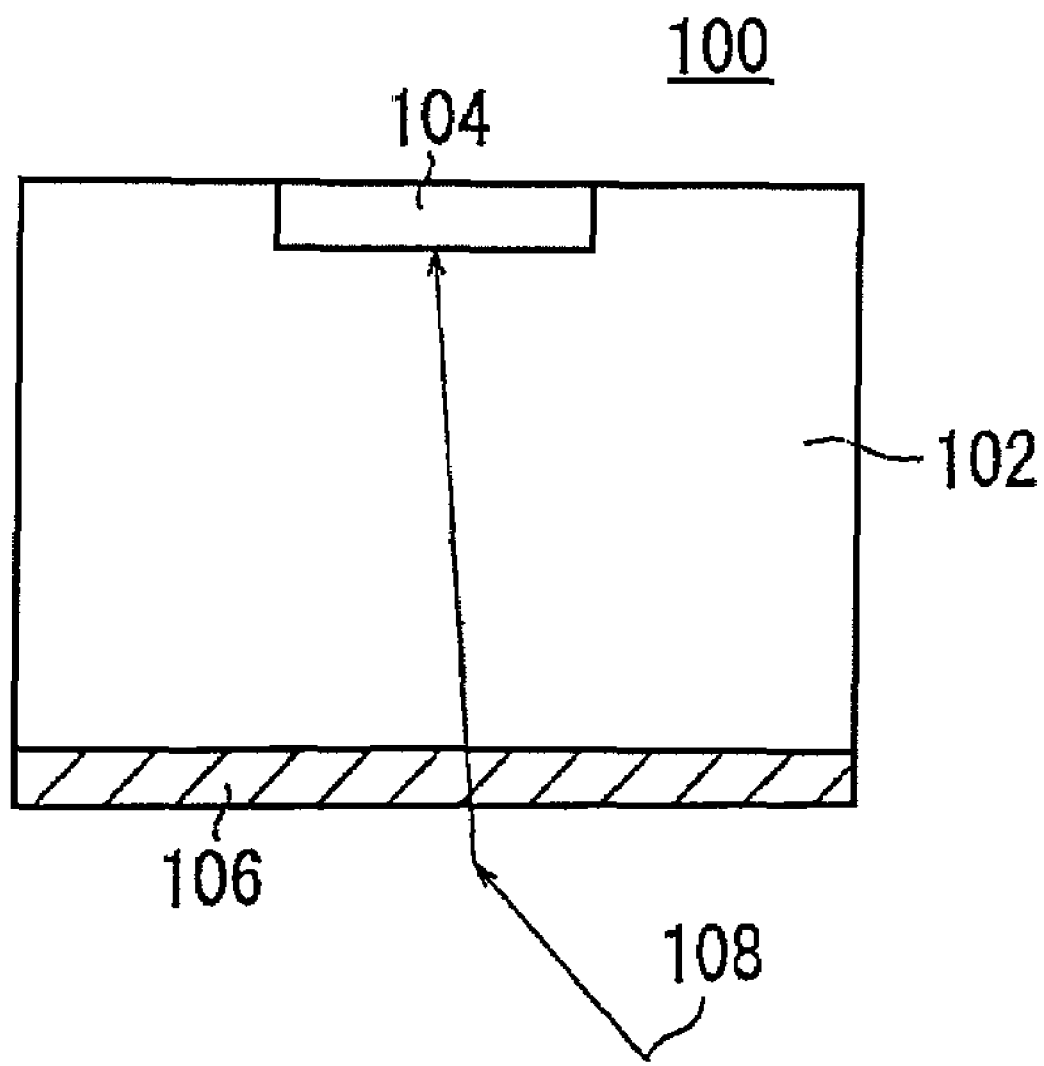
FIG. 13 is a cross-sectional view of a conventional photodetector device.

If a single-layer film 106 is disposed on the surface to which the branched light 108 is applied, as with the conventional photodetector device shown in FIG. 13, when the branched light 108 is applied obliquely to the surface, the detected current output from the photodetector region 104 varies depending on the polarization of the branched light 108, i.e., the polarization dependent loss is large.

According to the first specific example, however, the anti-reflective multilayer film 72 disposed on the reverse side of the base 54 can be designed to have film properties and a film thickness depending on an expected angle with respect to the obliquely applied branched light 26. As a result, polarization of the obliquely applied branched light 26 can be controlled, to reduce variations in the detected current, leading to a reduction in polarization dependent loss.

Figure 5:
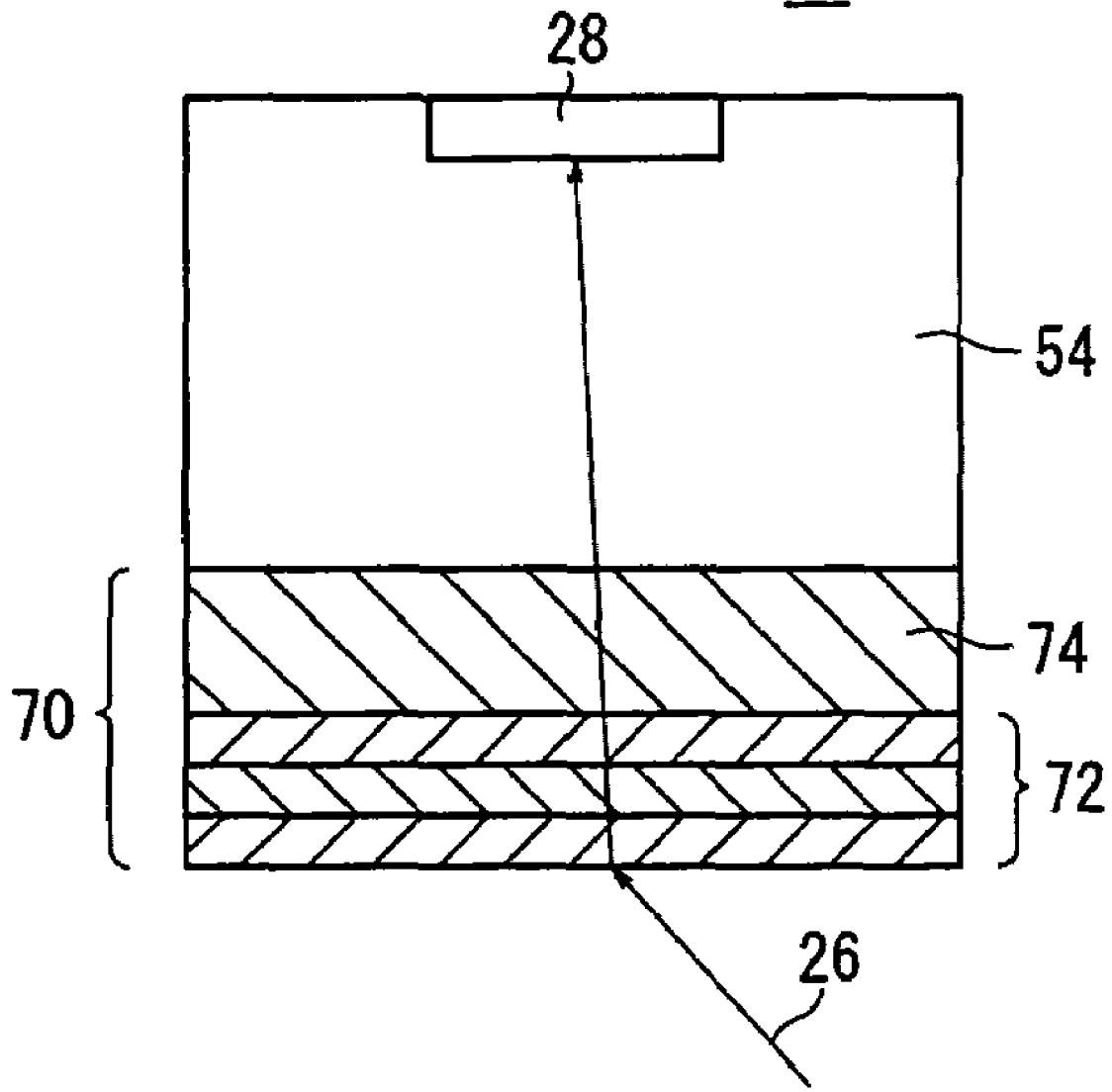
FIG. 5 is a cross-sectional view of a PD array according to a second specific example.

As shown in FIG. 5, a PD array 30B according to a second specific example, with only a representative portion thereof which corresponds to one channel being illustrated, has a moisture-resistant film 74 disposed on the reverse side of the base 54, and an anti-reflective multilayer film 72 disposed on an end face of the moisture-resistant film 74.

Depending on the conditions at which the multilayer film 72 is formed on the surface to which light is applied, the multilayer film 72 may become porous. If the multilayer film 72 becomes porous, then water passes through the multilayer film 72 and reaches the base 54, tending to degrade characteristics of the PD array 30B (increased leakage current, increased dark current, etc.). According to the second specific example, the coating film 70 comprises a laminated assembly made up of the moisture-resistant film 74 and the anti-reflective multilayer film 72, so that the PD array 30B has excellent moisture resistance and can stably pick up the detected current independently of polarization of the branched light 26.

Figure 6:
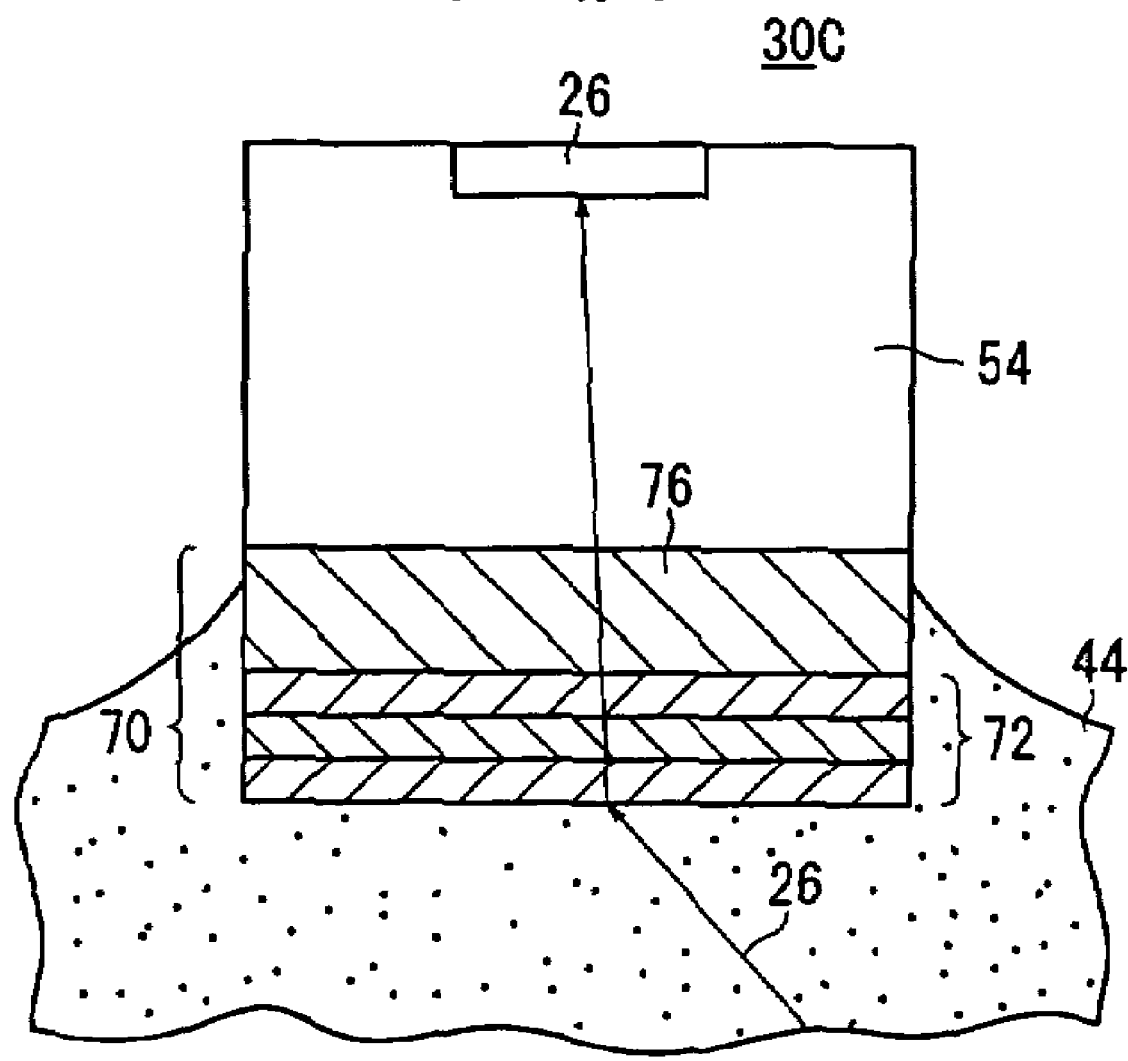
FIG. 6 is a cross-sectional view of a PD array according to a third specific example.

As shown in FIG. 6, a PD array 30C according to a third specific example, with only a representative portion thereof which corresponds to one channel being illustrated, has a film 76 for preventing degradation in characteristics due to the existence of the refractive index matching resin 44, disposed on the reverse side of the base 54, and the anti-reflective multilayer film 72 disposed on an end face of the film 76. The film 76 may be a moisture-resistant film 74, as described above.

The refractive index matching resin 44, which is disposed on the surface to which light is applied, may be a resin capable of adsorbing water. The multilayer film 72 alone is unable to prevent water from entering the base 54, and possibly may allow the characteristics of the PD array 30C to become degraded (increased leakage current, increased dark current, etc.). According to the third specific example, the coating film 70 is constructed of the film 76, which prevents degradation in characteristics due to the existence of the refractive index matching resin 44, together with the anti-reflective multilayer film 72, so that the PD array 30C has excellent moisture resistance and can stably pick up the detected current independently of polarization of the branched light 26.

Figure 7:
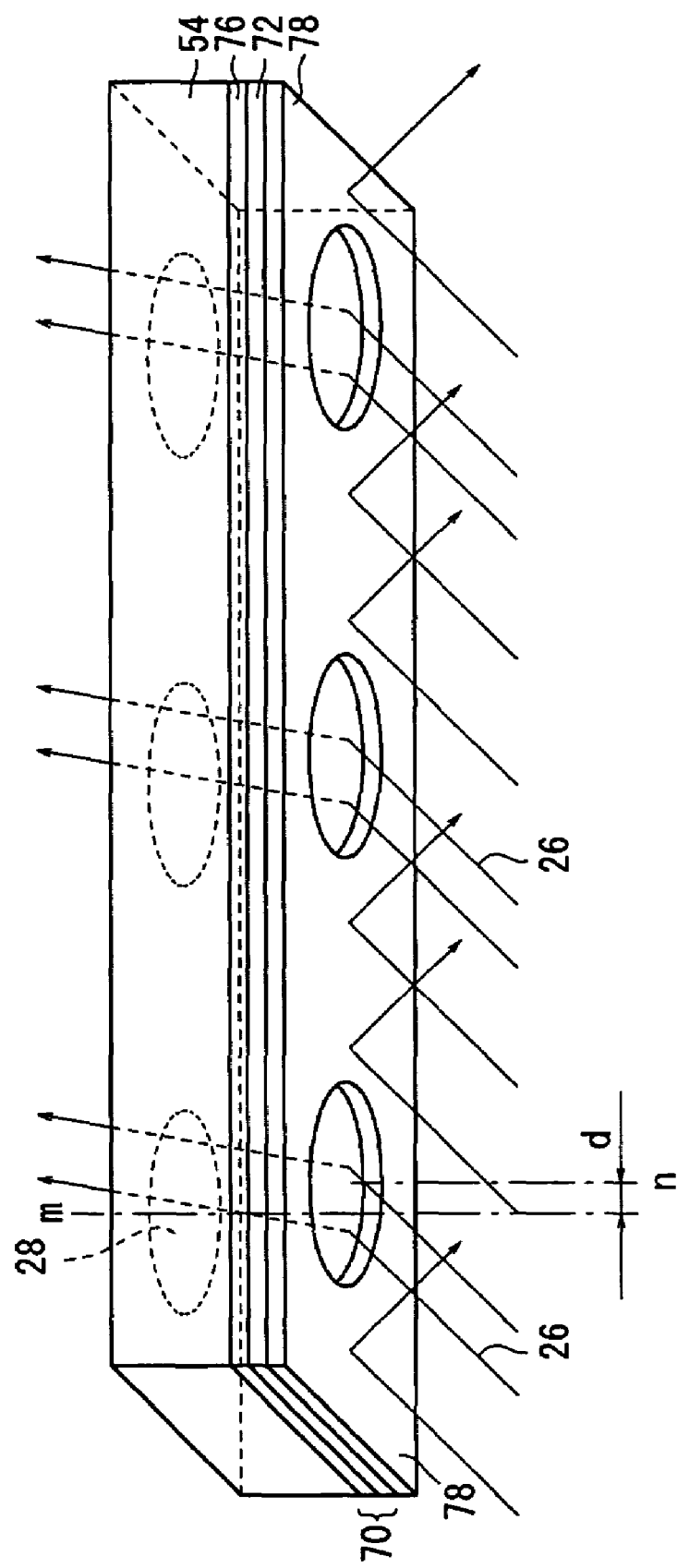
FIG. 7 is a cross-sectional view of a PD array according to a fourth specific example.

As shown in FIG. 7, a PD array 30D according to a fourth specific example, with only a representative portion thereof corresponding to three channels being illustrated, has one or more light blocking masks 78 (hereinafter referred to as masks) on the end face of the coating film 70. The masks 78 are disposed in a position on the end face of the coating film 70, which takes into account the branched light 26 that is obliquely applied to the coating film 70.

An important factor influencing characteristics of the output current of the PD array 30D, as well as polarization dependent loss, is crosstalk. One of the causes of crosstalk is stray light. When light is applied to a region of the PD array 30D other than the photodetector regions 28, and is repeatedly reflected and diffused, such light is applied as stray light to adjacent photodetector regions 28 or to other photodetector regions 28, causing crosstalk.

Figure 8:
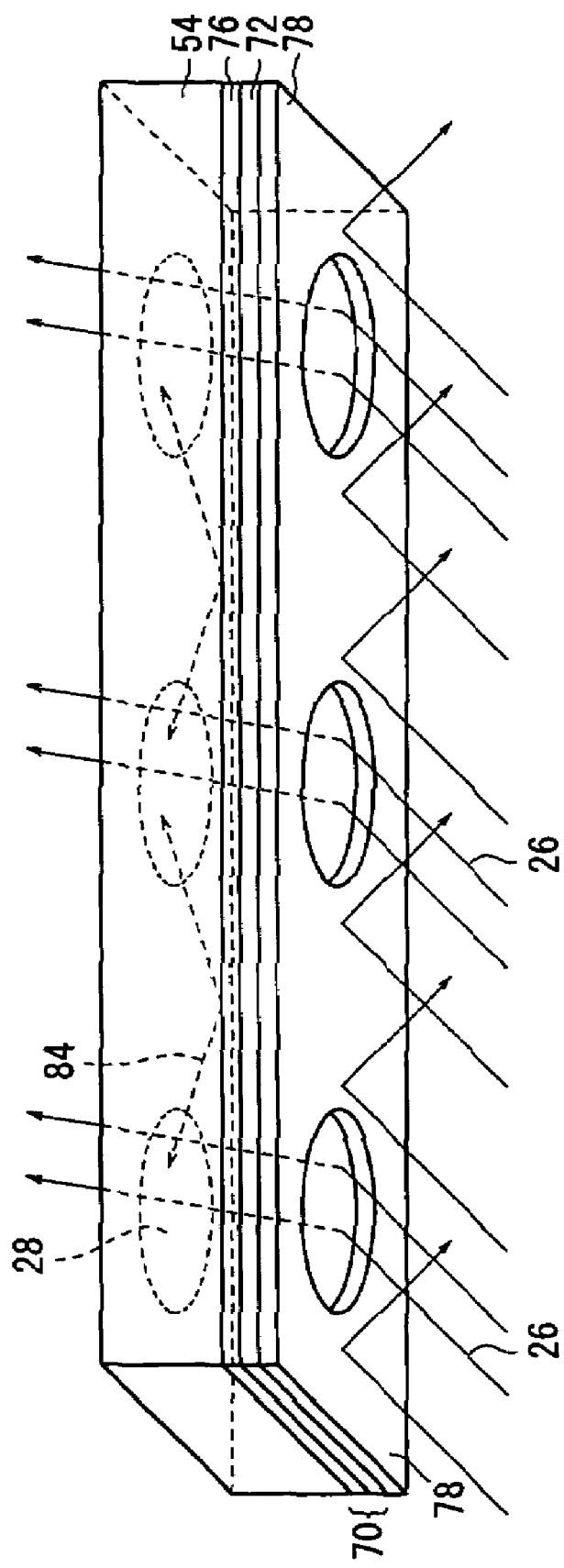
FIG. 8 is a cross-sectional view of a PD array according to a first comparative example.

FIG. 8 shows a PD array 80 according to a first comparative example. In the PD array 80, one effective means for preventing stray light is provided by a mask 78 disposed on the surface to which the branched light 26 is applied. The mask 78 limits application of the branched light 26, wherein the branched light 26 introduced into the PD array 80 is detected by the photodetector regions 28 and converted thereby into a current (detected current). No light is applied to regions other than the photodetector regions 28. The mask 78 is typically disposed in a position corresponding to the photodetector regions 28.

If the PD array is of a reverse-side-incident type, then a certain distance exists, extending from the end face of the coating film 70 to the photodetector regions 28. Even if the mask 78 on the end face of the coating film 70 has windows 82 disposed directly below the photodetector regions 28, the obliquely applied branched light 26 includes light that does not reach the photodetector regions 28, and such light may become stray light 84. In addition, light which ordinarily would enter the photodetector regions 28 is blocked by the mask 78, resulting in a reduction in efficiency.

With the PD array 30D according to the fourth specific example, as shown in FIG. 7, the mask 78 is disposed in a position, which takes into account the obliquely applied branched light 26, i.e., the mask 78 is offset. For example, if a line extending directly below the center of a photodetector region 28 is regarded as a reference line m, then the mask 78 is disposed such that the central line n of the window 82 of the mask 78 is displaced a predetermined distance d (e.g., 50 μm) from the reference line m toward the branching unit 36 (see FIG. 2). The mask 78 thus positioned is capable of almost fully eliminating stray light 84 while improving crosstalk and increasing light detection efficiency in the photodetector regions 28.

Figure 9:
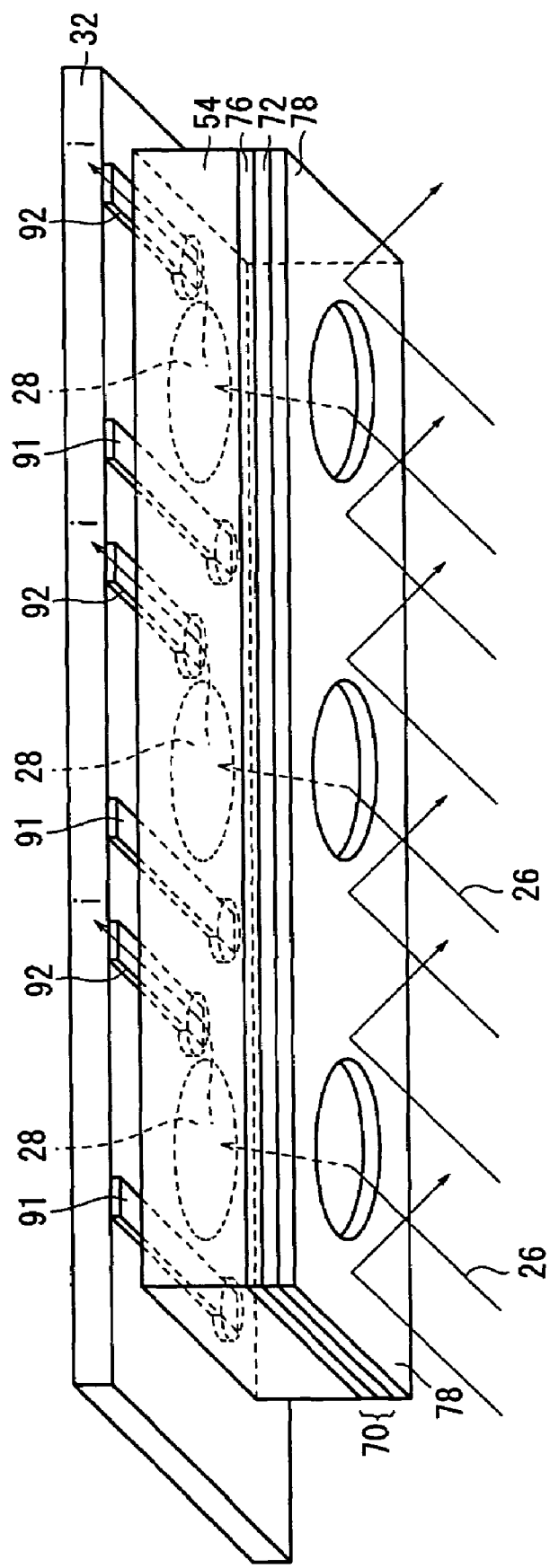
FIG. 9 is a cross-sectional view of a PD array according to a fifth specific example.
Figure 10:
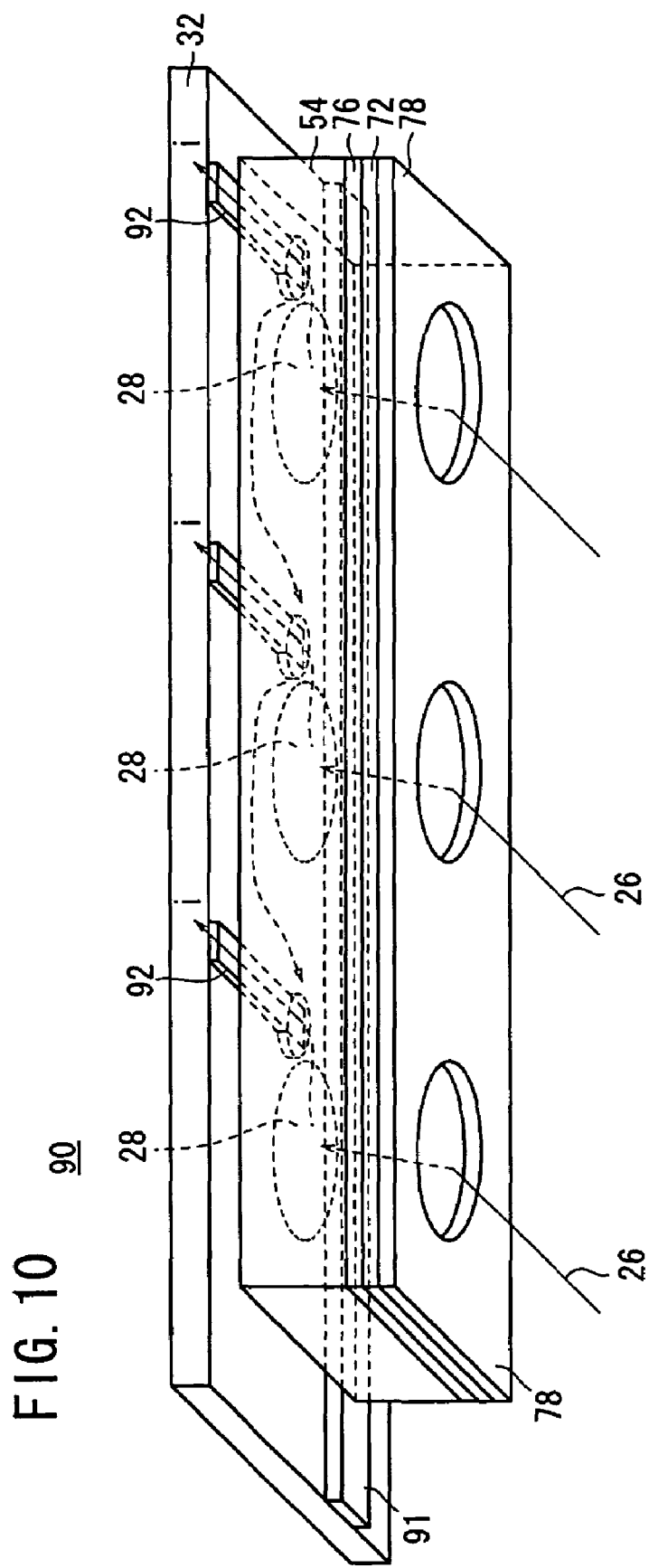
FIG. 10 is a cross-sectional view of a PD array according to a second comparative example.

As shown in FIG. 9, a PD array 30E according to a fifth specific example includes a cathode electrode 91 and an anode electrode 92, which correspond to each of the photodetector regions 28, disposed on the base 54.

Apart from optical crosstalk described above, electric crosstalk may also serve as a factor, which affects the characteristics of the output current i of the PD array 30E. Specifically, if a plurality of photodetector regions 28 are provided on the base 54, then since a common cathode electrode 91 is connected to each of the photodetector regions 28 in the PD array 90, according to a second comparative example shown in FIG. 10, for example, a portion of the electric charges generated in the photodetector regions 28 flows as leakage current id to the anode electrodes 92, through adjacent and/or other photodetector regions 28, resulting in electric crosstalk.

With the PD array 30E according to the fifth specific example, however, as shown in FIG. 9, since each of the photodetector regions 28 includes an anode electrode 92 and a cathode electrode 91, electric crosstalk is suppressed. If a low-resistance electrode (e.g., of Au) is connected to the cathodes, then the generated carrier does not leak into the cathodes of adjacent channels, but rather is pulled by the low-resistance electrode of Au, so that a reduction in crosstalk can be achieved.

Figure 11:
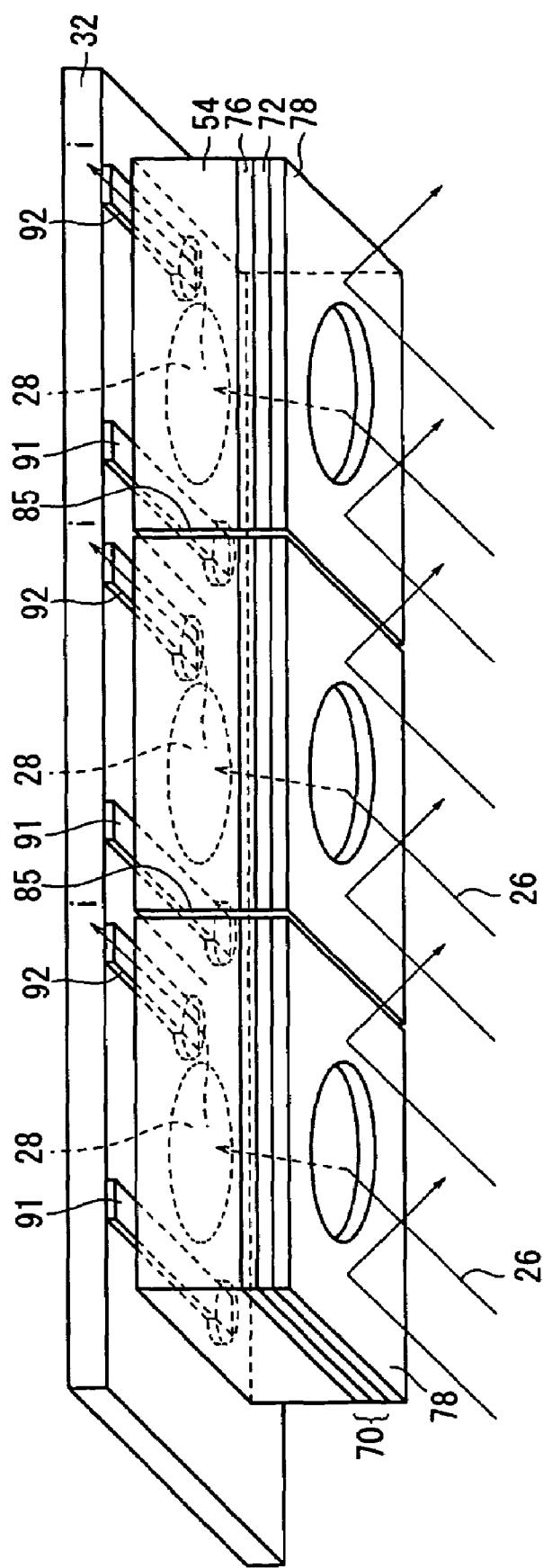
FIG. 11 is a cross-sectional view of a PD array according to a sixth specific example.

FIG. 11 shows a PD array 30F according to a sixth specific example, formed by another structure. The PD array 30F has a plurality of slits 85 defined in the base 54 between adjacent photodetector regions 28. In this arrangement, the PD array 30F has a cathode electrode 91 and an anode electrode 92, corresponding to each of the photodetector regions 28.

In the PD array 30F according to the sixth specific example, since the photodetector regions 28 are physically separated from each other by the slits 85, the path of the leakage current id is divided, and the detected currents i in the respective channels flow to corresponding anode electrodes 92, thereby preventing electric crosstalk described above. Furthermore, since stray light 84 does not enter into adjacent photodetector regions 28 or into other photodetector regions 28, crosstalk due to stray light 84 is also improved.

Figure 12:
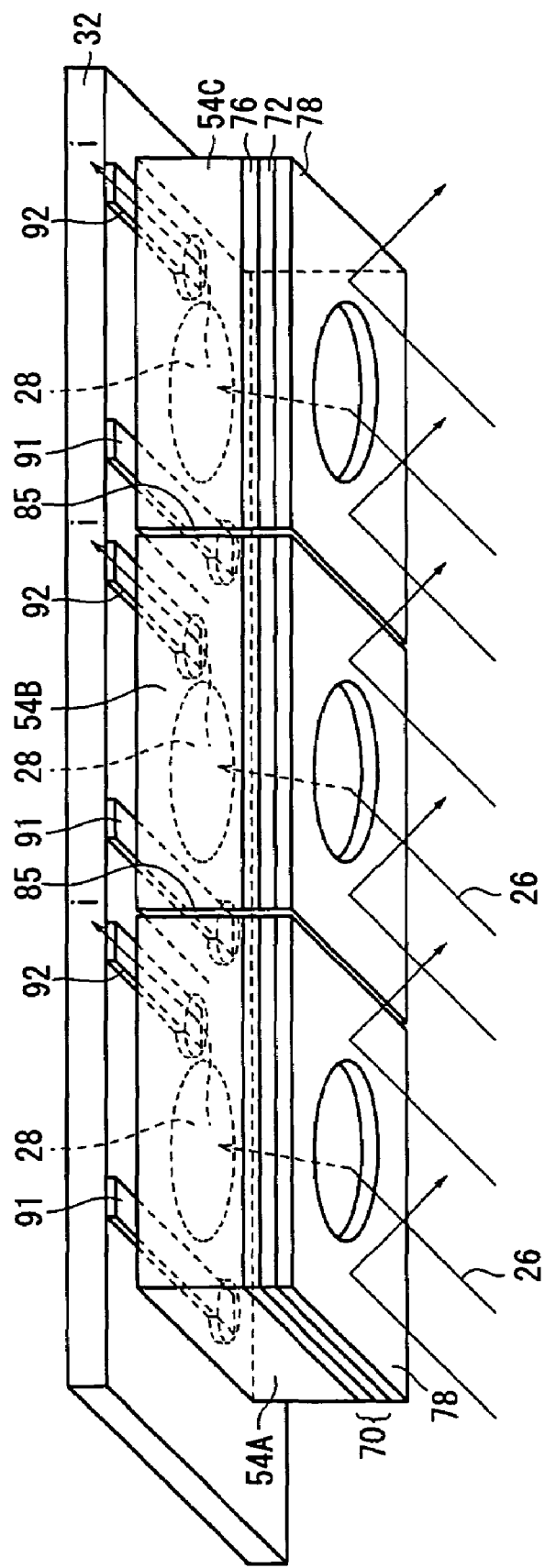
FIG. 12 is a cross-sectional view of a PD array according to a seventh specific example.

As shown in FIG. 12, a PD array 30G according to a seventh specific example has a plurality of bases 54A, 54B and 54C arrayed at given spaced intervals and having respective photodetector regions 28.

With this arrangement, since the path of the leakage current id is divided, the aforementioned problems of electric crosstalk are prevented. Furthermore, since stray light does not enter into adjacent photodetector regions 28 or into other photodetector regions 28, crosstalk due to stray light is also improved.

EXAMPLE

An example of the optical module 10 according to the present embodiment shall be described below. First, a glass substrate 12 for use in the optical module according to the example was fabricated by polishing. The glass substrate 12 was made of a borosilicate glass, e.g., a Pyrex (registered trademark) material. Twelve V-shaped grooves 14 having an angle of 70° were formed in the glass substrate 12.

Then, the optical fiber array 18 was assembled. The optical fiber array 18 comprised a 12-core ribbon fiber assembly having a pitch of 250 µm. The ribbon was peeled off from the 12-core ribbon fiber assembly to provide a peeled region having a length of 12 mm, and the optical fibers were placed in the V-shaped grooves 14 in the glass substrate 12 and fixed in place by a fixing adhesive 46.

Next, a slit 20 was formed in and across the optical fiber array 18. The slit 20 had a width of 30 µm, a depth of 200 µm, and a tilt angle α of 20°.

Then, the filter member 22 was fabricated. A multilayer film 50 made of materials selected from tantalum oxide, quartz, alumina, titanium oxide, etc. was evaporated on the quartz substrate 48. The quartz substrate 48 with the multilayer film 50 disposed thereon was machined into a member having a thickness of 20 µm, a length of 5 mm, and a width of 200 µm, thereby producing the filter member 22. The tilt angle was 20° and the branching ratio was 90% for transmission and 10% for reflection.

Thereafter, the filter member 22 was inserted into the slit 20, and the gap between the walls of the slit 20 and the filter member 22 was filled with a resin 52, which had substantially the same refractive index as the refractive index of the cores 40 of the optical fibers 16 (i.e., a refractive index which was different by about ±0.1 from the refractive index of the cores 40 of the optical fibers 16). In this manner, the filter member 22 was mounted in place. The resin 52 was a silicone resin. After the gap was filled with the resin 52, the resin 52 was cured.

Thereafter, the PD array 30 was mounted on the submount 32. The PD array 30 had 12 channels, a height of 150 µm, a width of 420 µm, and a length of 3 mm.

The PD array 30 was a reverse-side-incident type, in accordance with the optical module 10 according to the present embodiment. The region above the photodetector regions 28 (facing the submount 32) was filled with an anisotropic conductive paste 56.

More specifically, the PD array 30 comprised a 12-channel PIN photodiode. The photodetector regions 28 had a diameter of 60 µm and were spaced at a pitch of 250 µm. The base 54 had a thickness of 150 µm. The anode electrodes and the cathode electrodes were in the form of bumps 60 of Au having a thickness of 30 µm.

An SiN film, having a refractive index of 1.93, was deposited to a thickness of about 200 nm as a moisture-resistant film 74 on the reverse side of the PIN photodiode. The SiN film, which serves to increase the moisture resistance of the PD array and to protect the PD array, may have a thickness of 50 nm or greater. Subsequently, the PIN photodiode was cut into the PD array 30, which was then mounted on the submount 32 of alumina using a silver paste.

Thereafter, an anti-reflective multilayer film 72 was formed on the end face of the PD array 30 (the end face of the moisture-resistant film 74). On the assumption that the incident angle of the branched light 26 (angle with respect to the vertical line) was in a range of from 40 to 50°, the anti-reflective multilayer film 72 comprised a multilayer film 72 of $Al_2O_3$, $TiO_2$, and $Ta_4O_5$, taking into account the refractive index and film thickness of SiN.

When the PIN photodiode is cut into the PD array 30, the sides of the PD array 30 are entirely unprotected. Use of the multilayer film 72, which is formed after the PD array 30 is produced, is preferable in that it also serves as a protective layer.

Thereafter, a film of Au was selectively sputtered on the end face of the PD array 30 (end face of the multilayer film 72), thereby forming a mask 78 of Au. At this time, based on the assumption that the incident angle of the branched light 26 (angle with respect to the vertical line) was in the range of from 40 to 50°, the mask 78 was formed so that each window 82 thereof had a diameter of 80 µm and a central line n offset about 50 µm from the reference line m (see FIG. 7) toward the branching unit 36.

Thereafter, the PD array 30 was separated into channels. Specifically, the PD array 30 was cut at a pitch of 250 µm into channels each having a separation width of 30 µm, at a depth (150 µm or greater in this example) that was large enough to fully divide the base 54. Even when the PD array 30 is separated into channels, it remains mounted on the submount 32. Alternatively, the PD array 30 may be separated into channels before it is mounted on the submount 32, and the channels may subsequently be mounted in an array on the submount 32.

Next, the PD array 30 was aligned. Specifically, spacers 34, which define the gap between the optical fiber array 18 and the PD array 30, were mounted on the submount 32.

The spacers 34 were made of borosilicate glass. In particular, a Pyrex (registered trademark) glass material was used for the spacers 34. The gap had a length of 10 µm. Since the PD array 30, including the bumps 60 of Au, had an overall thickness of 190 µm, the spacers 34 had a thickness of 200 µm.

The upper portions of the optical fibers 16, which serve as an optical path for the branched light 26, were coated with a necessary amount of a refractive index matching resin 44 (i.e., a resin having the same properties as the resin 52 filling the slit 20). The PD array 30 was aligned by applying light to the channels on opposite ends of the optical fiber array 18, and performing an active alignment in order to maximize the detected PD power of the branched light 26 (i.e., the detected power at the photodetector regions 28 corresponding to the channels on the opposite ends). The detected PD power was monitored by applying a probe to the submount 32, in order to observe output current values from the photodetector regions 28 corresponding to the channels on the opposite ends. Alternatively, the position where the branched light 26 is emitted may be calculated, an alignment mark may be applied to locate the calculated position easily, and the PD array 30 may be aligned with the alignment mark (by way of passive alignment).

Thereafter, the PD array 30 was fixed to the optical fiber array 18 by application of ultraviolet radiation, thereby completing the optical module according to the present embodiment. Finally, the optical module according to the present embodiment was mounted in a package, resulting in a final product.

The optical device according to the present embodiment was then measured and evaluated. The polarization dependent loss of the branched light 26 had a good value of less than 0.2 dB for each channel, and a good crosstalk value of 40 dB or greater.

The optical device and the optical module according to the present invention is not limited to the above embodiments and examples, but various structural details may be adopted or modified without departing from the scope of the present invention as set forth in the appended claims.

What is claimed is:

1. An optical device comprising one or more photodetector regions disposed on a base, wherein a coating film for preventing degradation in characteristics is disposed directly on a surface of said base to which light is applied, an adhesive layer is disposed beneath said coating film on an optical path of reflected light, and one or more light blocking masks are disposed on an end face of said coating film, said light blocking masks being positioned with respect to light that is applied obliquely to said coating film, wherein all light is blocked where said light blocking the passage of light is desired said light blocking masks are not present.

2. An optical device according to claim 1, wherein said base is light-transmissive, said one or more photodetector regions being disposed on a surface of said base that opposes said surface to which light is applied.

3. An optical device according to claim 1, wherein said coating film comprises a laminated combination of two or more films.

4. An optical device according to claim 2, wherein two or more photodetector regions are disposed on said base, each of said photodetector regions including an anode electrode and a cathode electrode.

5. An optical device according to claim 3, wherein said coating film comprises an anti-reflective multilayer film.

6. An optical device according to claim 3, wherein said coating film comprises a laminated combination of a moisture-resistant film and an anti-reflective multilayer film.

7. An optical device according to claim 3, wherein a refractive index matching resin is provided on said surface to which light is applied, and said coating film comprises a laminated combination of a film for preventing degradation in characteristics due to the existence of said resin and an anti-reflective multilayer film.

8. An optical device according to claim 7, wherein said film for preventing degradation in characteristics due to the existence of said resin comprises a moisture-resistant film.

9. An optical device according to claim 1, wherein two or more photodetector regions are disposed on said base, and said base comprises a slit defined between said photodetector regions.

10. An optical device according to claim 1, wherein a plurality of said bases are arrayed at predetermined intervals, each of said bases comprising a photodetector region.

11. An optical module comprising:
one or more light transmitting means having a light branching function; and
an optical device disposed above said light transmitting means and fixed by a resin within an optical path of branched light generated at least by said light branching function of said light transmitting means,
wherein said optical device comprises a base, one or more photodetector regions disposed on said base, a coating film for preventing degradation in characteristics disposed directly on a surface of said base to which light is applied, adhesive layer disposed beneath said coating film on an optical path of reflected light, and one or more light blocking masks are disposed on an end face of said coating film, said light blocking masks positioned with respect to light that applied obliquely to said coating film, wherein all light is blocked where said light blocking mask are present and where the passage of light is desired said light blocking masks are not present.

* * * * *

UNITED STATES PATENT AND TRADEMARK OFFICE
CERTIFICATE OF CORRECTION

| | |
|---|---|
| PATENT NO. | : 7,324,718 B2 |
| APPLICATION NO. | : 11/414971 |
| DATED | : January 29, 2008 |
| INVENTOR(S) | : Yasunori Iwasaki and Akiyoshi Ide |

Page 1 of 1

It is certified that error appears in the above-identified patent and that said Letters Patent is hereby corrected as shown below:

Column 13

*Line 3*: please add --masks are present and where-- after "light blocking"

Column 14

*Line 19*: please add --an-- before "adhesive"

Signed and Sealed this

Twenty-fourth Day of June, 2008

JON W. DUDAS
*Director of the United States Patent and Trademark Office*